(12) United States Patent
Yu et al.

(10) Patent No.: US 9,111,896 B2
(45) Date of Patent: Aug. 18, 2015

(54) PACKAGE-ON-PACKAGE SEMICONDUCTOR DEVICE

(71) Applicants: Chen-Hua Yu, Hsinchu (TW); Der-Chyang Yeh, Hsinchu (TW)

(72) Inventors: Chen-Hua Yu, Hsinchu (TW); Der-Chyang Yeh, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 13 days.

(21) Appl. No.: 13/803,609

(22) Filed: Mar. 14, 2013

(65) Prior Publication Data

US 2014/0054760 A1 Feb. 27, 2014

Related U.S. Application Data

(60) Provisional application No. 61/692,893, filed on Aug. 24, 2012.

(51) Int. Cl.
*H01L 23/34* (2006.01)
*H01L 21/56* (2006.01)
*H01L 23/00* (2006.01)
*H01L 23/31* (2006.01)
*H01L 23/36* (2006.01)
*H01L 23/373* (2006.01)
*H01L 23/498* (2006.01)
*H01L 25/03* (2006.01)
*H01L 25/065* (2006.01)

(52) U.S. Cl.
CPC .............. *H01L 23/34* (2013.01); *H01L 21/561* (2013.01); *H01L 21/565* (2013.01); *H01L 21/568* (2013.01); *H01L 23/3128* (2013.01); *H01L 23/3135* (2013.01); *H01L 23/36* (2013.01); *H01L 23/3737* (2013.01); *H01L 23/49811* (2013.01); *H01L 23/49816* (2013.01); *H01L 23/49833* (2013.01); *H01L 24/19* (2013.01); *H01L 24/29* (2013.01); *H01L 24/94* (2013.01); *H01L 24/96* (2013.01); *H01L 24/97* (2013.01); *H01L 25/03* (2013.01); *H01L 25/0657* (2013.01); *H01L 25/0655* (2013.01); *H01L 2224/0401* (2013.01); *H01L 2224/04105* (2013.01); *H01L 2224/12105* (2013.01); *H01L 2224/16225* (2013.01); *H01L 2224/32145* (2013.01); *H01L 2224/32225* (2013.01); *H01L 2224/48227* (2013.01); *H01L 2224/73253* (2013.01); *H01L 2224/73267* (2013.01); *H01L 2224/94* (2013.01); *H01L 2224/97* (2013.01); *H01L 2225/0651* (2013.01); *H01L 2225/06568* (2013.01); *H01L 2225/06589* (2013.01); *H01L 2924/15311* (2013.01); *H01L 2924/18161* (2013.01); *H01L 2924/3511* (2013.01)

(58) Field of Classification Search
CPC ................. H01L 23/3672; H01L 2224/32245; H01L 23/367; H01L 23/50; H01L 23/34; H01L 23/373
USPC .................... 257/686, 692, 723, 777
See application file for complete search history.

(56) References Cited

U.S. PATENT DOCUMENTS 6,784,023 B2 * 8/2004 Ball ............................. 438/113
2012/0032340 A1 * 2/2012 Choi et al. ..................... 257/774

*Primary Examiner* — Roy Potter
(74) *Attorney, Agent, or Firm* — Lowe Hauptman & Ham, LLP

(57) ABSTRACT

A semiconductor device and method of forming the semiconductor device, the semiconductor device includes a package having at least one first die and at least one second die. The semiconductor device further includes a set of conductive elements electrically connecting the at least one first and the at least one second die to a substrate. The semiconductor device further includes a thermal contact pad between the at least one first die and the at least one second die, to thermally isolate the at least one first die from the at least one second die.

20 Claims, 18 Drawing Sheets

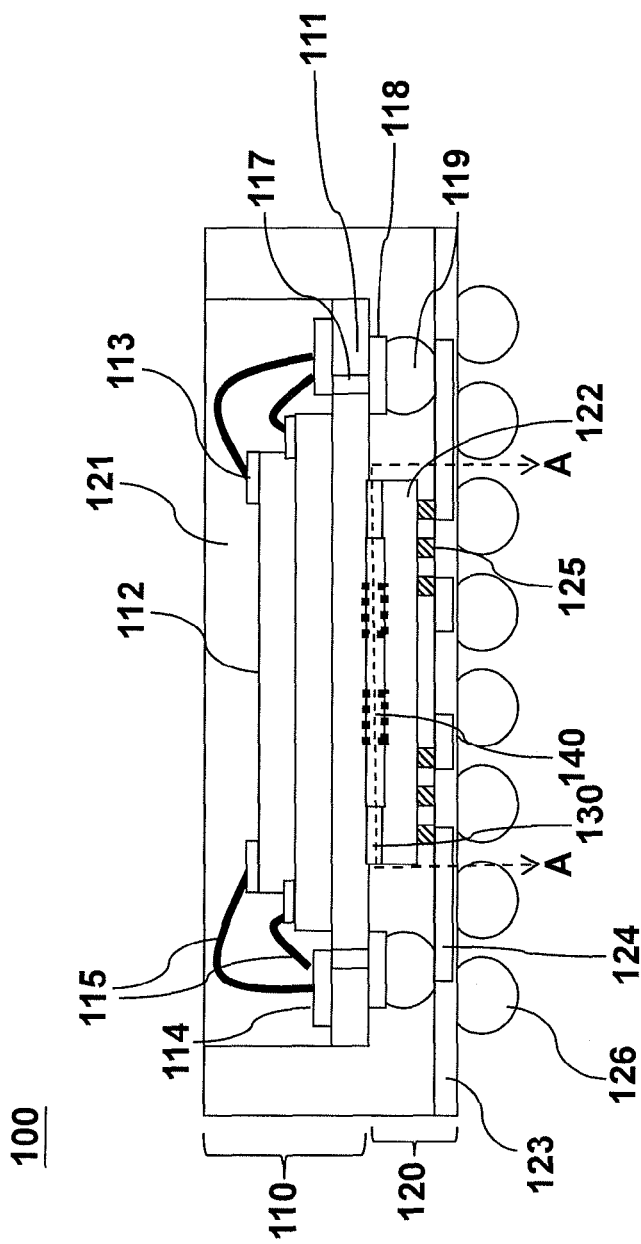
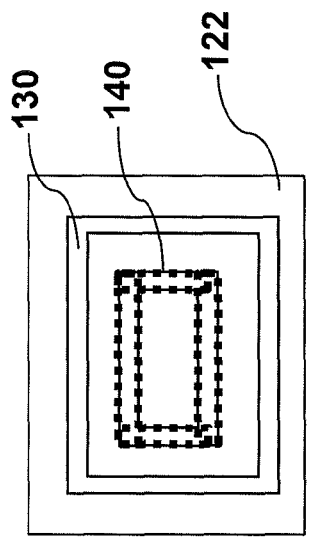
FIG. 1A
FIG. 1B

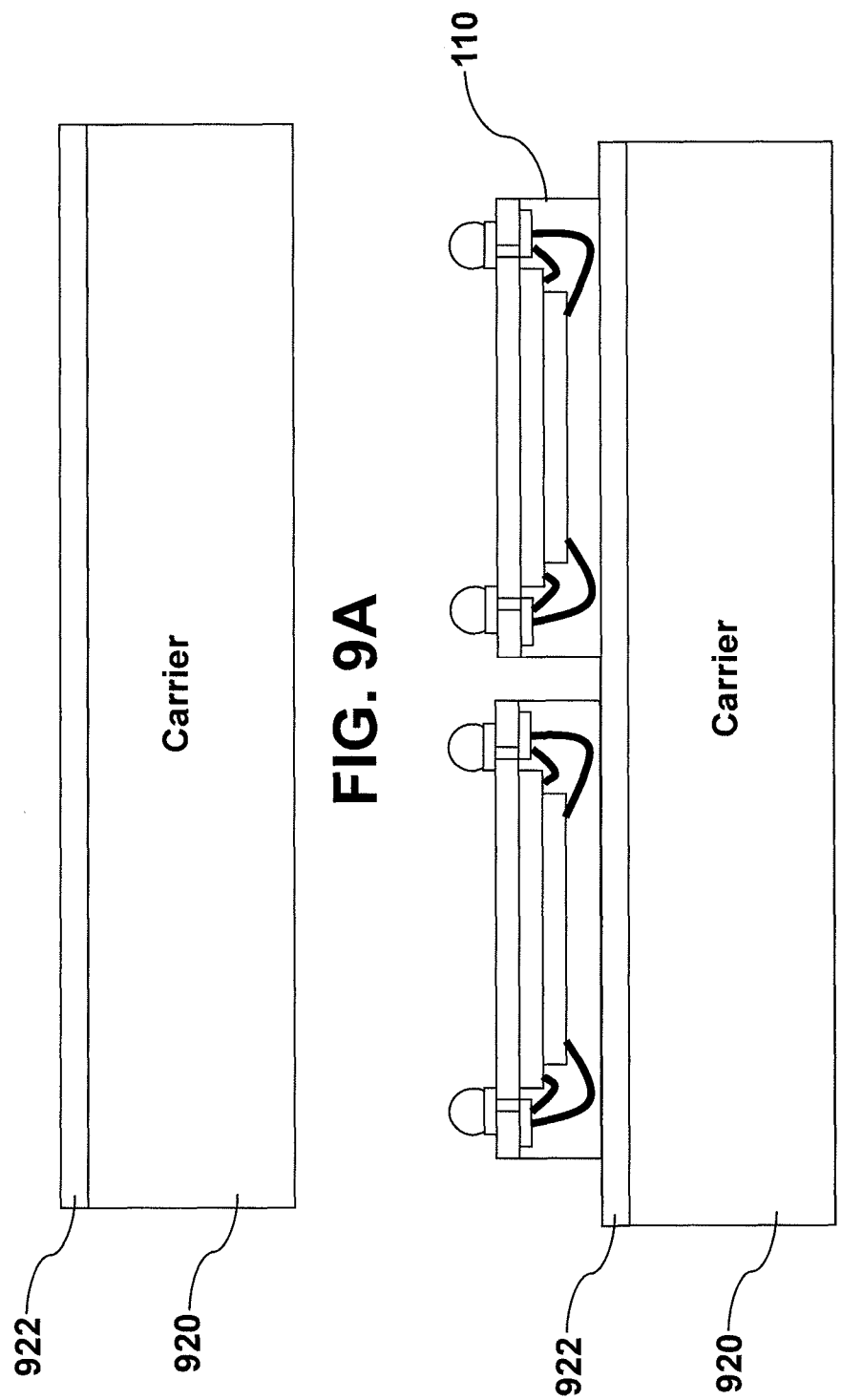

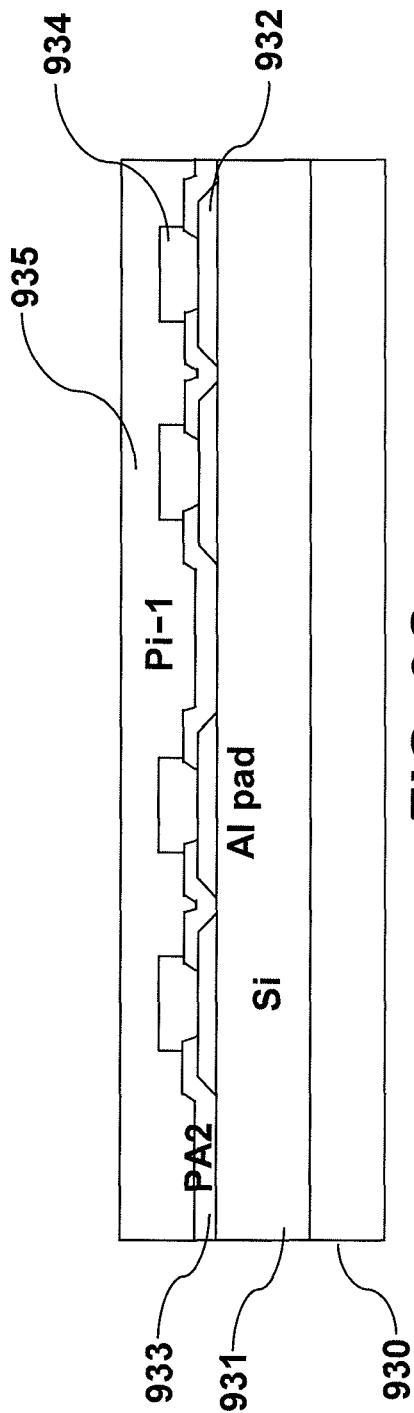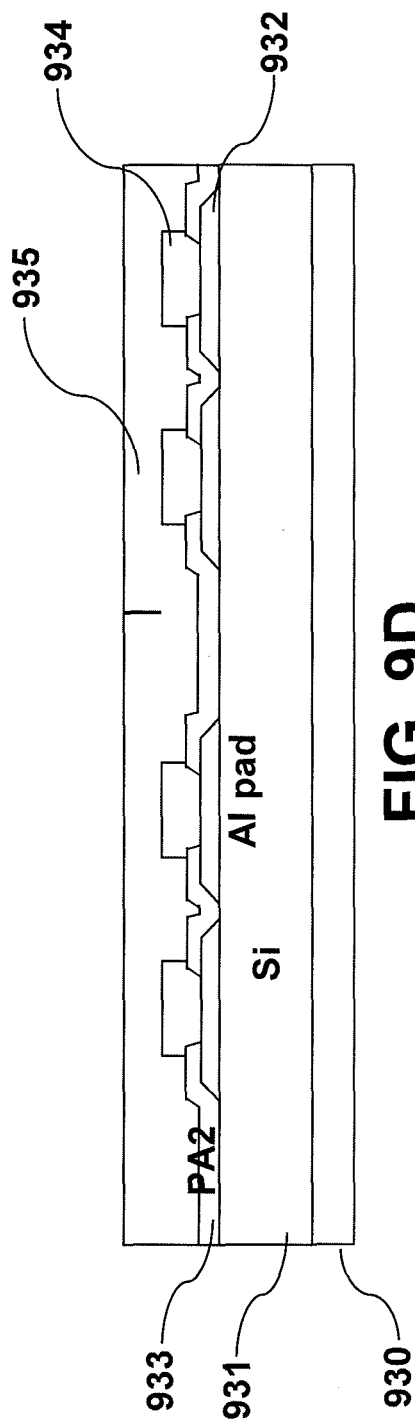

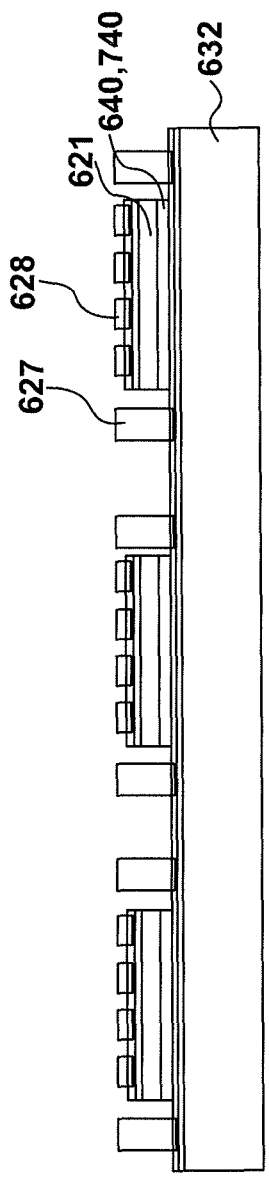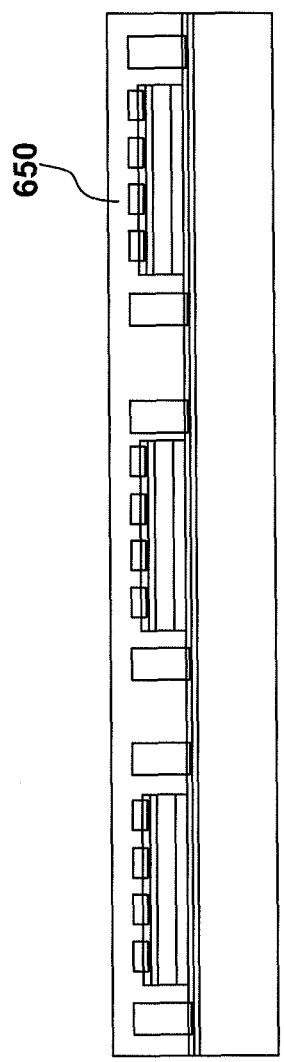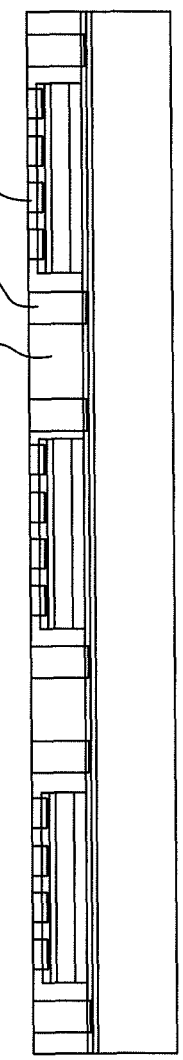

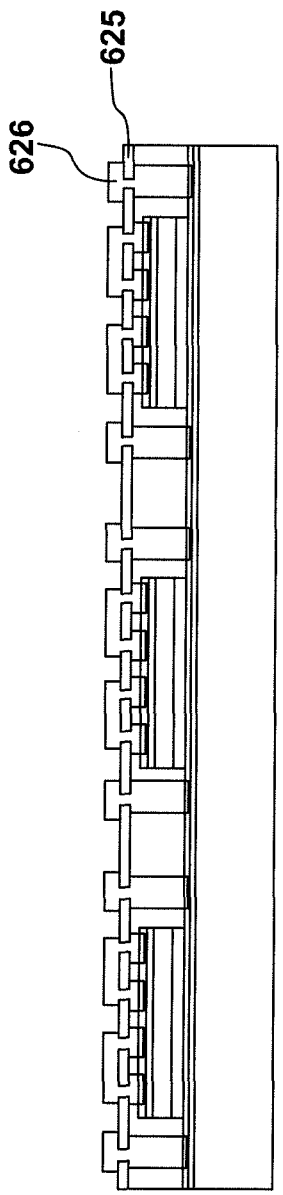 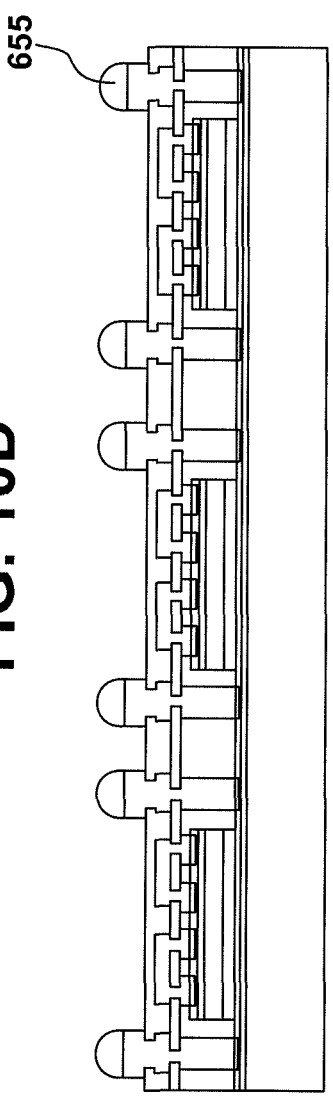 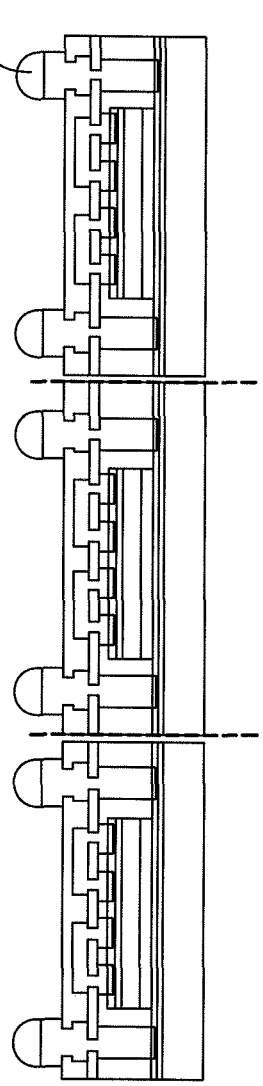

PACKAGE-ON-PACKAGE SEMICONDUCTOR DEVICE

CROSS-REFERENCE TO RELATED APPLICATION

The present application claims the priority of U.S. Provisional Application No. 61/692,893, filed Aug. 24, 2012, the disclosure of which is incorporated herein by reference in its entirety.

BACKGROUND

A Package-on-package (PoP) semiconductor device is used for high density electronic devices, and typically includes a bottom package component and a top package component combined together to form the PoP semiconductor device. The bottom package component includes a bottom die attached to a bottom packaging substrate and the top package component includes a top die attached to a top packaging substrate. The bottom and top package components are coupled together by a set of conductive elements, e.g., solder balls. During operation of the PoP semiconductor device, the bottom die typically generates heat that can cause cracks within the conductive elements and damage to the top die which results in thermal stress and warpage of the PoP semiconductor device.

BRIEF DESCRIPTION OF THE DRAWINGS

Reference is now made to the following descriptions taken in conjunction with the accompanying drawings, in which:

FIG. 1A is a cross sectional view of a top package and a bottom package of a package-on-package (PoP) semiconductor device in accordance with one or more embodiments;

FIG. 1B is a top view of a thermal contact pad of the PoP semiconductor device in FIG. 1 in accordance with one or more embodiments;

FIGS. 9A through 9I are cross sectional views of a method of forming the PoP semiconductor device in FIG. 1 in accordance with one or more embodiments;

FIGS. 10A through 10F are cross sectional views of a method of forming a bottom package in FIGS. 6 and 7 in accordance with one or more embodiments.

DETAILED DESCRIPTION

Figure 2:
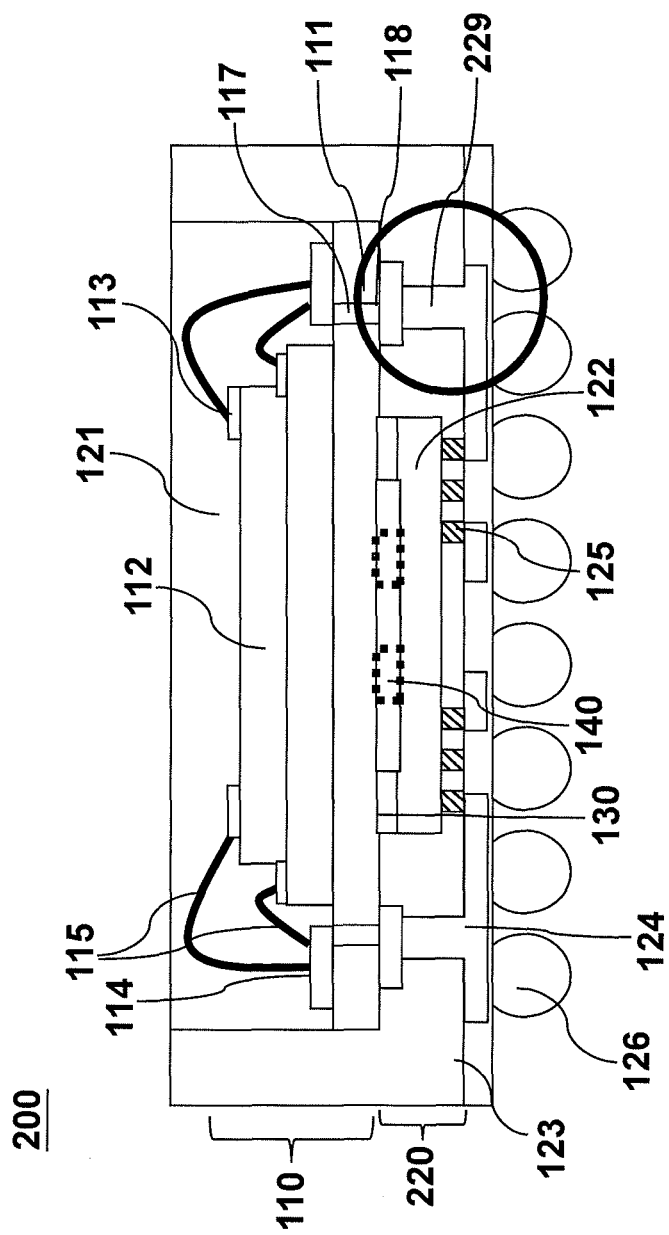
FIG. 2 is a cross sectional view of a top package and a bottom package of a PoP semiconductor device in accordance with one or more embodiments.

The making and using of the embodiments of the disclosure are discussed in detail below. It should be appreciated, however, that the embodiments provide many applicable inventive concepts that can be embodied in a wide variety of specific contexts. The specific embodiments discussed are examples, and are not intended to limit the scope of the disclosure.

In FIG. 1A, a package-on-package (PoP) semiconductor device 100 includes a first package (e.g., a top package 110). The top package 110 includes a packaging substrate 111 and a plurality of stacked dies 112 electrically connected to the packaging substrate 111 by wire-bonding. The dies 112 are wire-bonded to the packaging substrate 111 using conductive contacts 113 (e.g., metal contacts) on a top surface of each die of the stacked dies 112 and contacts 114 on the packaging substrate 111 and bond wires 115 connecting the contacts 113 and 114 together.

According to one or more embodiments, each die of the stacked dies 112 comprises a memory chip, a logic chip, or a processor chip. Further, although the plurality of stacked dies 12 only includes two dies, the present disclosure is not limited to the particular number of dies. The dies are not limited to being wire-bonded to the packaging substrate 111. Other methods for connecting the stacked die 112 to the packaging substrate 111 will be discussed below with reference to FIGS. 4 and 5. According to one or more embodiments, solder bumps, solder balls, copper pillars, conductive bumps, solder caps, conductive pillars, conductive balls, under-bump metallurgies, andor other connector elements are usable to connect the stacked die 112 to the packaging substrate 111. In some embodiments, an underfill is in a gap between the stacked die 112 and the packaging substrate 111 to thereby reinforce the strength of the PoP structure 100.

The packaging substrate 111 is a laminated circuit board comprising alternating layers of non-conductive polymers, such as bismaleinide-triazine (BT), and patterned or non-patterned conductive layers. The packaging substrate 111 includes top contacts 114, conductive vias 117, and bottom contacts 118 for electrical connection to other components. Solder balls 119 are used to electrically or thermally connect the top package 110 to a second package (e.g., a bottom package 120). The solder balls 119 electrically conduct signals and power to the stacked die 112. In one or more embodiments, the solder balls 119 are replaced with other conductive elements, such as conductive bumps and conductive balls (as depicted in FIG. 2, for example).

Further, as shown in FIG. 1A, a first molding compound 121 is formed on the top package 110 and provides mechanical stiffness, thereby enhancing the mechanical strength of the PoP structure 100. The molding compound 121 is molded on the packaging substrate 111 using a compressive molding or transfer molding process, for example, and surrounds the stacked die 112, the conductive contacts 113, 114, and the bond wires 115. In one or more embodiments, a curing operation is performed to solidify the molding compound 121. The molding compound 121 includes a polymer-based material, an underfill, or an epoxy, for example.

The bottom package 120 is attached to the top package 110 and includes a die 122 on a lower substrate 123. The die 122 is electrically connected with the lower substrate 123 by conductive elements (e.g., 124 and 125). According to one or more embodiments, the lower substrate 123 is a single crystal silicon lower substrate having one or more conductive layers. In some embodiments, the substrate is a ceramic substrate or polymer substrate. In some embodiments, a lower substrate 123 is used during a wafer-level packaging (WLP) process to package many dies 122. In some embodiments, the entire packaging process, including attaching the bottom package 120 and the top package 110, is completed before the lower substrate 123 is diced. According to one or more embodiments, the substrate is used in various parts of the process as an interface between electrical connections. In some embodiments, the lower substrate is provided or formed over electrical contacts and includes dielectric material and conductive elements formed within the lower substrate and over the lower substrate.

According to one or more embodiments, the die 122 is a logic chip, a processor chip, a memory chip, or the like. In at least some embodiments, the conductive elements 124 are metal contacts and the conductive elements 125 are metal pillars formed of copper (Cu). Alternatively, according to other embodiments, the conductive elements 124 and 125 are solder bumps, solder balls, copper pillars, conductive bumps, solder caps, conductive balls, and under-bump metallurgies.

An electrical connection between the die 122 and other circuitry is provided by the conductive elements (e.g., solder balls 119) on one side of the lower substrate 123 and the conductive elements (e.g., solder balls 126) on the opposite side of the lower substrate 123.

During operation of the PoP structure 100, the top package 110 and the bottom package 120 generate heat. In some embodiments, the heat generated by the bottom package 120 is greater than that generated by the top package 110, and potentially causes damage to the top package 110. A seal ring 130 and a thermal contact pad 140 are provided between a top surface of the die 122 and a bottom surface of the packaging substrate 111 to minimize heat transfer from the bottom package 120 to the top package 110 and prevent thermal stress and warpage in the PoP structure 100. The seal ring 130 provides a seal to insulate the top package 110 from heat generated by the bottom package 120. The thermal contact pad 140 comprises at least one of an oxide material, a nitride material, a molding compound or a polymer material. According to one or more embodiments, the thermal contact pad 140 comprises an adhesive material, such as epoxy or tape. In other embodiments, the thermal contact pad 140 is another plastic or silicone material. According to various embodiments, suitable material for the thermal contact pad 140 has a thermal conductivity of about or less than 0.5 WattsCelsius (W° C.) and is suitable for semiconductor processing and use in a semiconductor device under various operating conditions.

FIG. 1B is a top view of section A-A of FIG. 1A. According to one or more embodiments, the thermal contact pad 140 is a non-continuous layer. That is, the thermal contact pad 140 does not cover an entire top surface of the die 122. As shown in FIG. 1B, the seal ring 130 and the thermal contact pad 140 are of a non-continuous layer (e.g., a hollow rectangular shape). In other embodiments, the thermal contact pad 140 is of a circular shape such as a ring, an X shape, checkered shape, or any other suitable shape for the purpose set forth herein. According to one or more embodiments, the thermal contact pad 140 is a solid, continuous material along the top surface of the die 122 and fills the area within the seal ring 130. In one or more embodiments, a thickness of the thermal contact pad 140 is greater than approximately 10 microns (μm).

A second molding compound 142 is molded on the lower substrate 123 and surrounds the bottom package 120 including the die 122, between the seal ring 130 and the thermal contact pad 140 (e.g., at an outside of the thermal contact pad 140 and interposed between portions (i.e. segments) of the thermal contact pad as shown in FIG. 1A). The second molding compound 142 also surrounds the conductive elements (e.g., solder balls 119) and is between the conductive elements (e.g., metal contacts 125), for example. In addition, the second molding compound 142 surrounds the top package 110 including a bottom and side surfaces of the packaging substrate 111 and the first molding compound 121. In at least some embodiments, the second molding compound 142 is formed using compressive molding or transfer molding. In one or more embodiments, a curing operation is performed to solidify the second molding compound 142. In at least some embodiments, the molding compound 142 includes a polymer-based material, an underfill, or an epoxy.

According to one or more embodiments, the present disclosure is not limited to the use of solder balls 119 for electrically connecting the top package 110 with the bottom package 120. FIG. 2 is a cross sectional view of a top package 110 and a bottom package 220 of a PoP semiconductor device 200 in accordance with one or more embodiments.

The PoP semiconductor device 200 includes top package 110 as depicted in FIG. 1 and a bottom package 220 having the same components as that of the bottom package 120 with the exception of the use of conductive pillars 229 in place of the solder balls 119.

Figure 3:
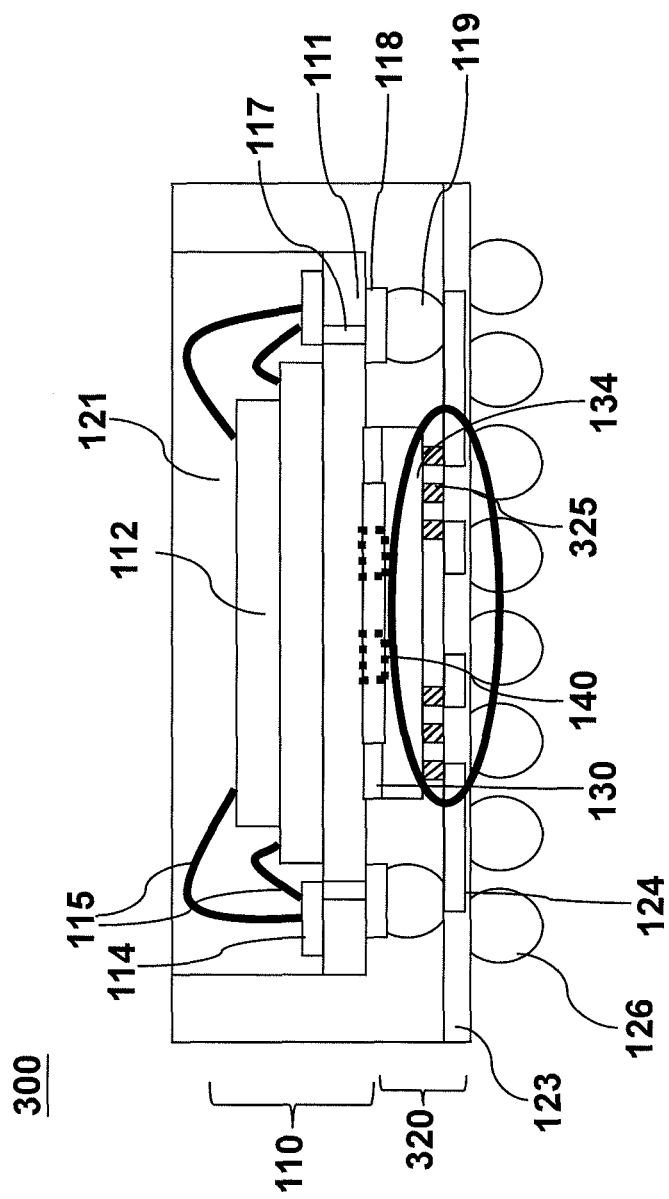
FIG. 3 is a cross sectional view of a top package and a bottom package of a PoP semiconductor device in accordance with one or more embodiments.

Further, according to one or more embodiments, the present disclosure is not limited to the use of conductive vias 125 for electrically connecting the die 122 to the lower substrate 123. FIG. 3 is cross sectional view of a top package 110 and a bottom package 320 of a PoP semiconductor device 300 in accordance with one or more embodiments. The PoP semiconductor device 300 includes a top package 110 as depicted in FIG. 1 and a bottom package 320 having the same components as that of the bottom package 120 with the exception of the use of solders 325 in place of the conductive vias 125 for electrically connecting the die 122 to the lower substrate 123.

The present disclosure is also not limited to the stacked die configuration in the top package 110 as shown in FIGS. 1-3. In other embodiments, the dies are formed in a side-by-side parallel configuration as shown in FIG. 4.

Figure 4:
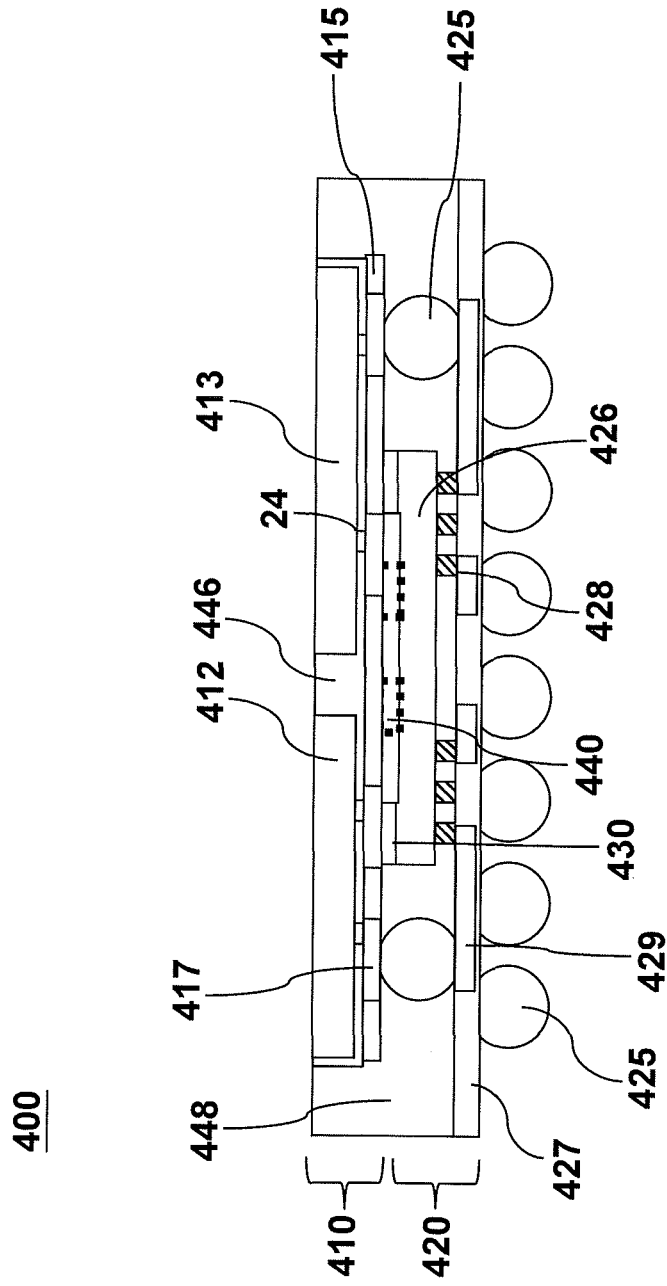
FIG. 4 is a cross sectional view of a top package and a bottom package of a PoP semiconductor device in accordance with one or more embodiments.

FIG. 4 is cross sectional view of a top package 410 and a bottom package 420 of a PoP semiconductor device in accordance with one or more embodiments. The top package 410 includes at least a first die 412 and a second die 413 adjacent to each other on a first upper substrate 415. The first die 412 and the second die 413 are electrically connected with the first upper substrate 415 by conductive elements (e.g., vias 416 and contacts 417). In the current embodiment, bonding wires and contact pads are not used to electrically connect the first die 412 and the second die 413 to the first upper substrate 415.

The top package 410 and the bottom package 420 are electrically connected together by conductive elements (e.g., solder balls 425). The bottom package 420 includes a die 426 electrically connected with a second lower substrate 427 by conductive elements (e.g., vias 428 and contacts 429). A seal ring 430 is between the first upper substrate 415 and the die 426 of the bottom package 420. A thermal contact pad 440 is between the top package 410 and the bottom package 420. As shown, the thermal contact pad 440 is between a top surface of the die 426 and the first upper substrate 415 and adjacent to the seal ring 430. The thermal contact pad 440 is a non-continuous layer. A first molding compound 446 is one the first upper substrate 415 and surrounds the top package 410 including the first die 412 and the second die 413 and the conductive elements (e.g., metal vias 416 and metal contacts 417). A second molding compound 448 is provided on the second upper substrate 427. The second molding compound 448 surrounds the first molding compound 446. Further, the second molding compound 448 is between portions of the thermal contact pad 440 and the seal ring 430, and surrounds the conductive elements (e.g., solder balls 425, metal vias 428 and metal contacts 429).

Although the dies 412 and 413 are shown in a side-by-side configuration in FIG. 4, the present disclosure is not limited to the particular configuration. In alternative embodiments, the dies 412 and 413 can be in a stacked configuration as discussed below with reference to FIG. 5.

Figure 5:
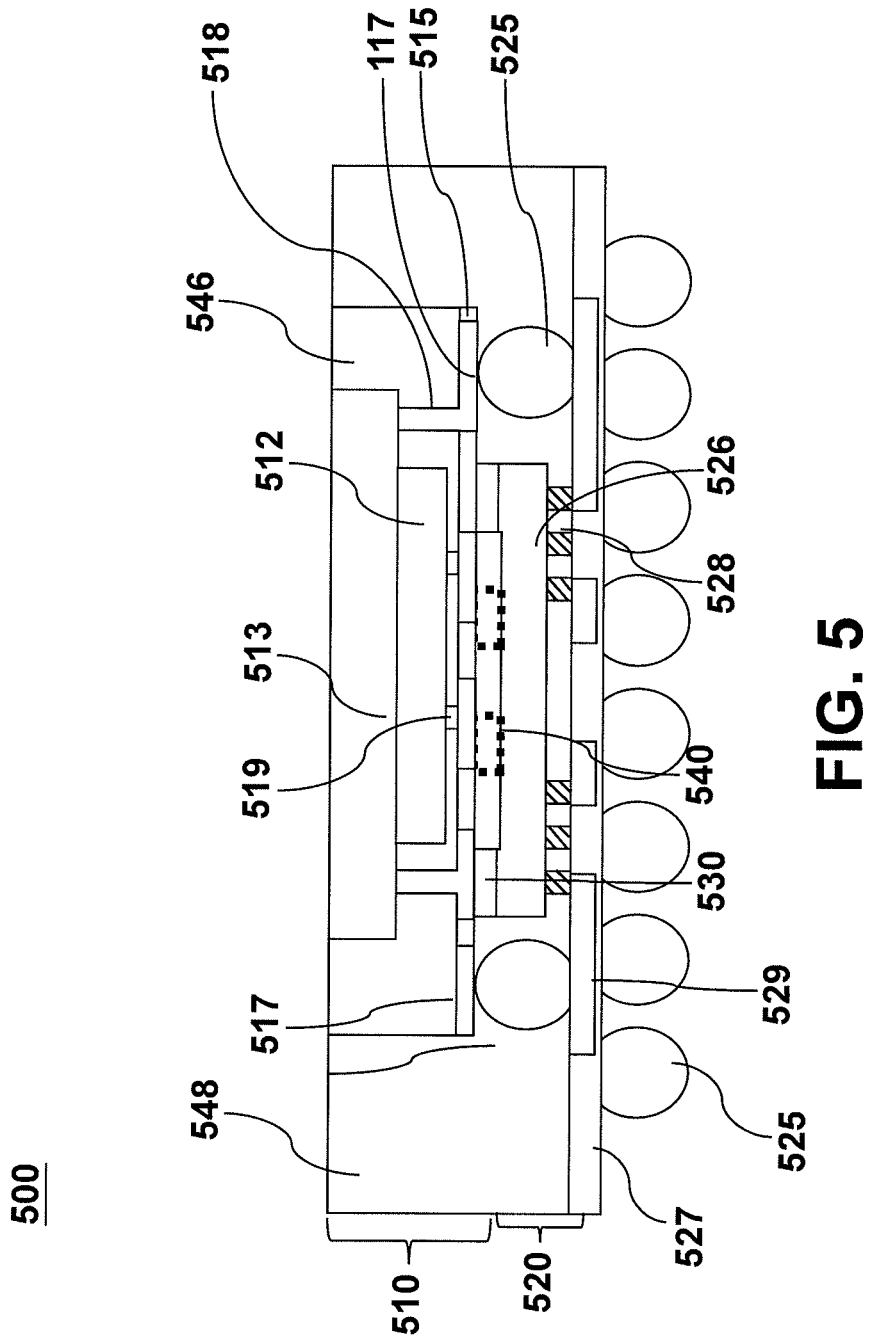
FIG. 5 is a cross sectional view of a top package and a bottom package of a PoP semiconductor device in accordance with one or more embodiments.

FIG. 5 is cross sectional view of a top package 510 and a bottom package 520 of a PoP semiconductor device 500 in accordance with one or more embodiments. The top and bottom package 510 and 520 of the PoP semiconductor device 500 include the same components as the PoP semiconductor device 400 shown in FIG. 4, with the exception that first and second dies 512 and 513 are in a stacked configuration. As shown in FIG. 5, according to one or more embodiments, the second die 513 is larger than the first die 512 and is stacked on a surface of the first die 512. The first die 512 is between the second die 513 and a first upper substrate 515. The first upper substrate 515 is smaller than the first upper substrate 415 shown in FIG. 4. The first and second dies 512 and 513 are electrically connected with the first upper substrate 515 by conductive elements (e.g., metal contacts 517 and metal pillars 518). The metal pillars 518 extend in a horizontal direction to facilitate the connection between the second die 513 and the first upper substrate 515. The first die 513 is connected with the first upper substrate 515 by conductive elements (e.g. metal vias 519). The top package 510 is electrically connected with the bottom package 510 by conductive elements (e.g., solder balls 525). The bottom package 520 includes a die 526 electrically connected with a second lower substrate 527 by conductive elements (e.g., metal vias 528 and metal contacts 529). A seal ring 530 and a thermal contact pad 540 are formed between the first upper substrate 515 and the die 526 to thermally isolate the top package 510 from the bottom package 520. A first molding compound 546 is one the first upper substrate 515 and surrounds the top package 510 including the first die 512 and the second die 513 and the conductive elements (e.g., metal vias 517 and metal contacts 519). A second molding compound 548 is provided on the second lower substrate 527. The second molding compound 548 surrounds the first molding compound 546, is between portions of the thermal contact pad 540 and the seal ring 530 between the top package 510 and the bottom package 520, and the conductive elements (e.g., solder balls 525, metal vias 528 and metal contacts 529).

The present disclosure is not limited to a bottom package of a PoP semiconductor device having only a single die. According to one or more embodiments, the bottom package includes more than one die in a stacked wafer level package (WLP) structure having a thermal contact pad sandwiched between the dies to provide thermal isolation between the dies.

Figure 6:
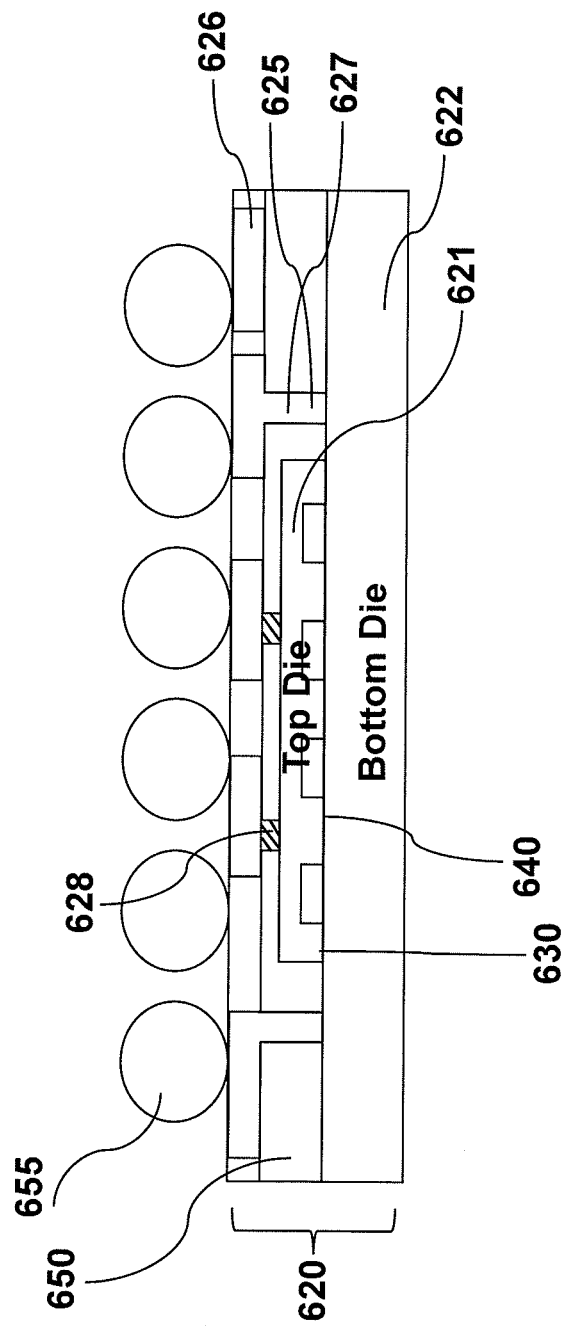
FIG. 6 is a cross sectional view of a bottom package in accordance with one or more embodiments.

FIG. 6 is cross sectional view of a bottom package 620 in accordance with one or more embodiments. The bottom package 620 has at least a first die 621 and a second die 622. The first die 621 is between the second die 622 and a lower substrate 625. The dies 621 and 622 are electrically connected with the lower substrate 625 by conductive elements (e.g., metal pillars 626, metal pads 627 and metal vias 628). The second die 622 is connected with the lower substrate 625 by the metal pillars 622 and metal pads 627. The first die 621 is electrically connected with the lower substrate 625 by the metal vias 628. According to one or more embodiments, the second die 622 is larger than the first die 621. The second die 622 extends parallel to the lower substrate 625 and is of a same length as the lower substrate 625. The first die 621 is between the metal vias 627. A seal ring 630 and a thermal contact pad 640 are sandwiched between the first die 621 and the second die 622 and provide thermal isolation. According to one or more embodiments, the thermal contact pad 640 is of a same configuration as the thermal contact pad 140 (FIG. 1). A molding compound 650 is between the lower substrate 625 and the second die 622, and between portions of the thermal contact pad 640 and the seal ring 630. Additional conductive elements (e.g., solder balls 655) are provided on a side of the lower substrate 625, opposite the side of the first and second dies 621 and 622.

Figure 7:
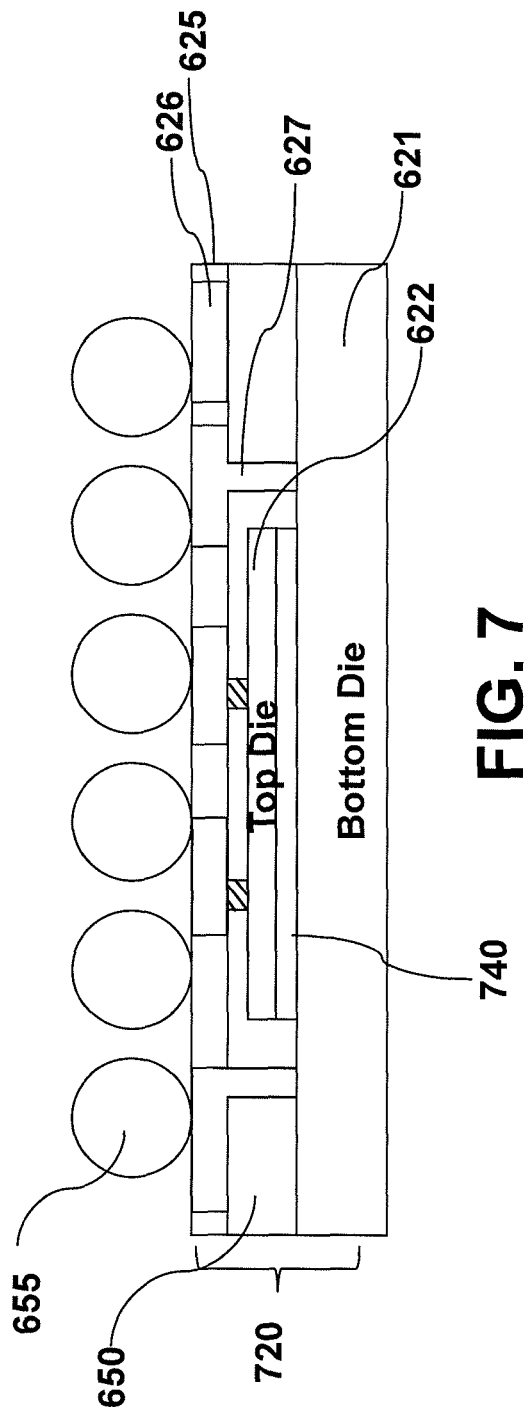
FIG. 7 is a cross sectional view of a bottom package in accordance with one or more embodiments.

FIG. 7 is a cross sectional view of a bottom package 720 in accordance with one or more other embodiments. The bottom package 720 includes the same components as the bottom package 620 (FIG. 6) with the exception that the thermal contact pad 740 is a continuous layer.

Figure 8:
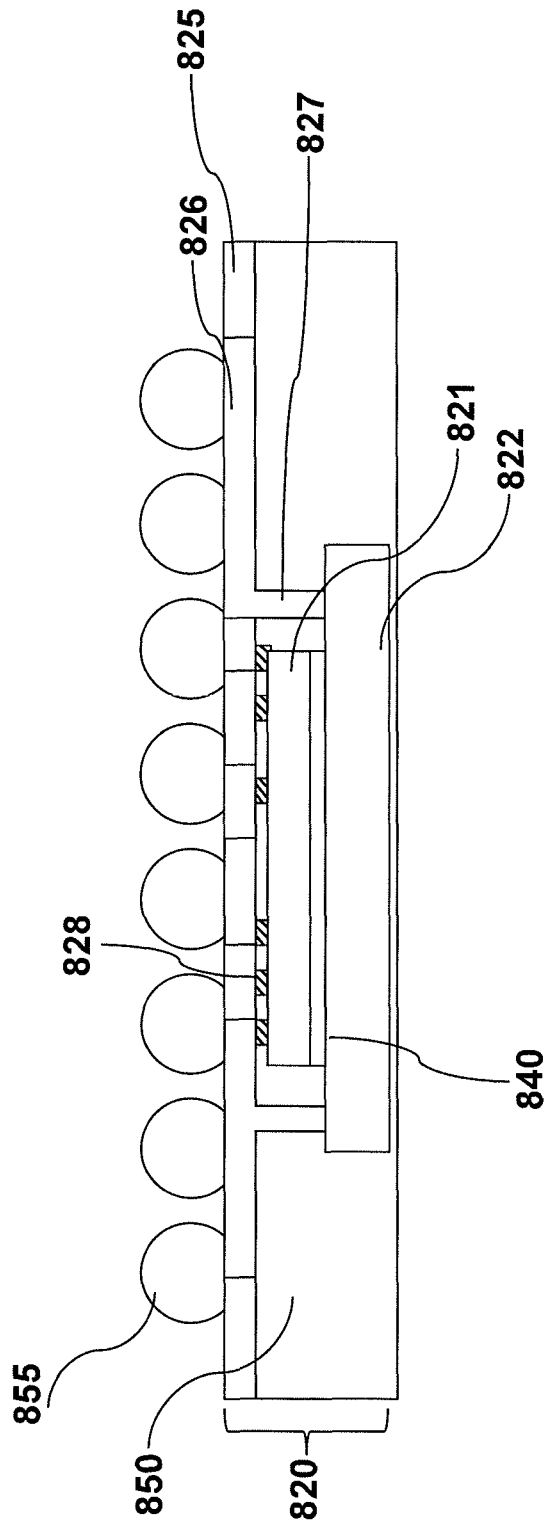
FIG. 8 is a cross sectional view of a bottom package in accordance with one or more embodiments.

FIG. 8 is a cross sectional view of a bottom package 820 in accordance with one or more other embodiments. The bottom package 820 includes the same components as the bottom package 720 in a different configuration. The bottom package 820 includes a first die 821 and a second die 822. The second die 822 is electrically connected with a lower substrate 825 by conductive elements (e.g., metal contacts 826 and metal pillars 827). The metal pillars 827 extend in the horizontal direction to facilitate the connection between the second die 822 and the lower substrate 825. The first die 821 is electrically connected with the lower substrate 825 by conductive elements (e.g., metal vias 828). A thermal contact pad 840 of a continuous layer is sandwiched between the first die 821 and the second die 822. A molding compound 850 is on the lower substrate 825, and surrounds the first die 821 and the second die 822, and is between portions of the thermal contact pad 840 and a seal ring, and the conductive elements (e.g., metal pillars 827 and metal vias 828).

Figure 9E:
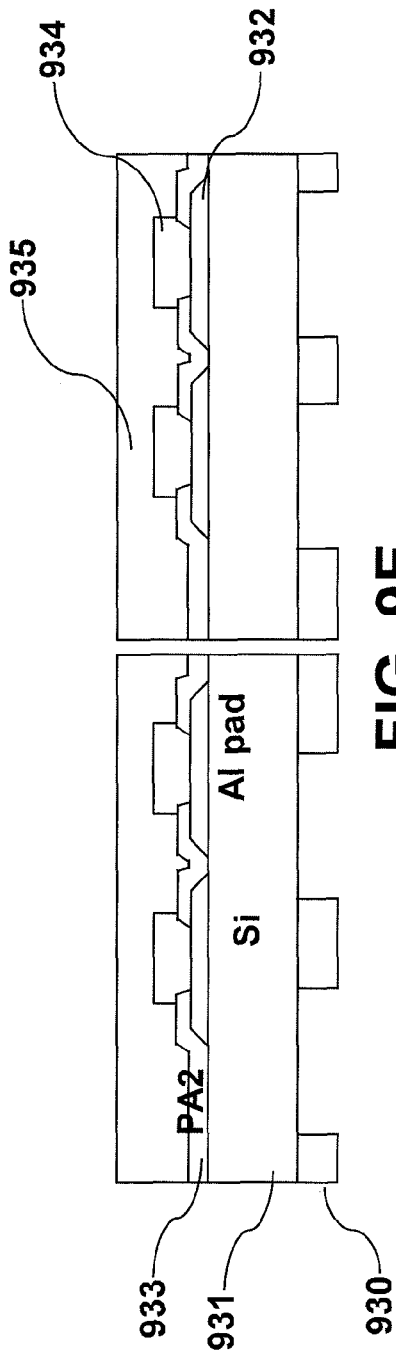

FIGS. 9A through 9I are cross sectional views of a method for forming a PoP semiconductor device such as the semiconductor device of FIG. 1 in accordance with one or more embodiments. In FIG. 9A, a thin adhesive layer 922 is deposited on a carrier 920 via a deposition process, to prepare the carrier 920 for processing. In FIG. 9B, a top package (e.g., top package 110 as depicted in FIG. 1, for example) is deposited on the carrier 920. Next, in FIGS. 9C through 9D, a bottom package (e.g., bottom package 120 as depicted in FIG. 1) is formed. In FIG. 9C, a grinding process is performed on a backside of a substrate 930 to form a die layer 931 (e.g., die 122), and a metal pad (e.g., an aluminum pad 932) is deposited on the die layer 931. A passivation layer 933 (a thin oxide layer) is deposited on the aluminum pad 932. The passivation layer 933 is etched to create trenches or vias and metal layer 934 is deposited within the trenches or vias for forming metal vias (e.g., metal vias 125). An underfill layer 935 formed of a polyimide (Pi) material then deposited on a surface of the passivation layer 933 and over the metal layer 934.

In FIG. 9D, a thermal contact material 940 is formed on the grinded surface of the die layer 931; and in FIG. 9E a thermal contact pad (e.g., thermal contact pad 140 as depicted in FIG. 1) is formed by etching or by sawing, laser grooving or mechanical sawing process. A singulation process is then performed to form separate bottom packages (e.g., bottom package 120).

Figure 9F:
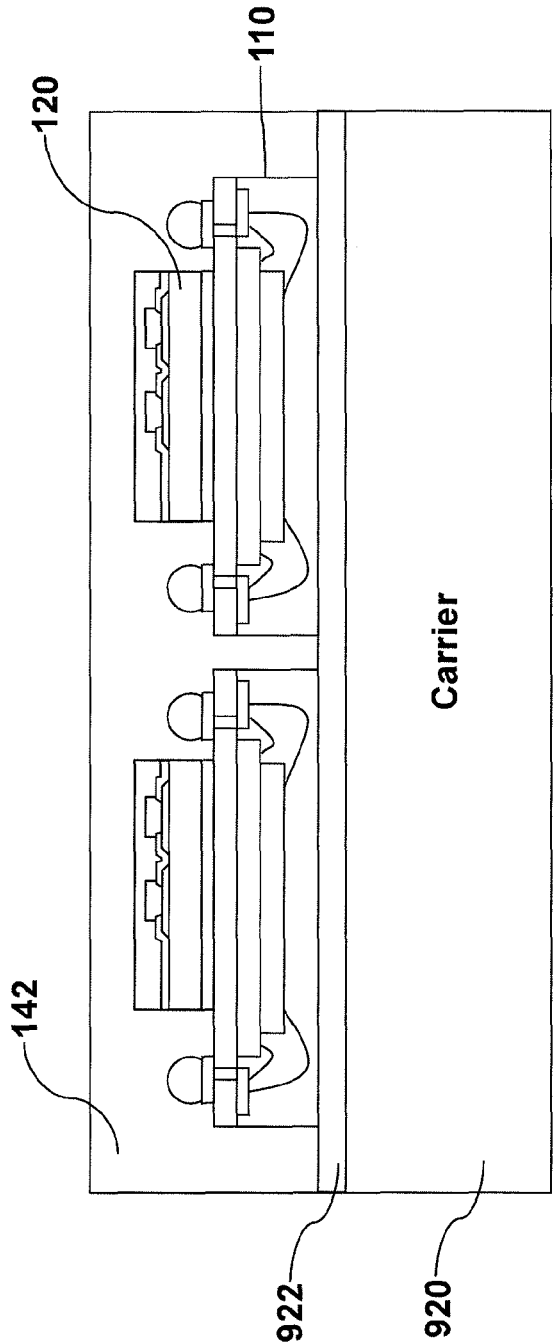

In FIG. 9F, the bottom package 120 is disposed on the top package 110. The thermal contact pad 140 is aligned with a package substrate (e.g., package substrate 111) of the top package 110. A molding compound 142 is molded on the lower substrate 123 and surrounds the bottom package 120 including the die 122 and the thermal contact pad 140. The molding compound 142 also surrounds the conductive elements (e.g., solder balls 119 as shown in FIG. 1A) and the top package 110 including a bottom and side surfaces of the packaging substrate 111 and a molding compound of the top package 110 (e.g., first molding compound 121). In at least some embodiments, the molding compound 142 is formed using compressive molding or transfer molding.

Figure 9G:
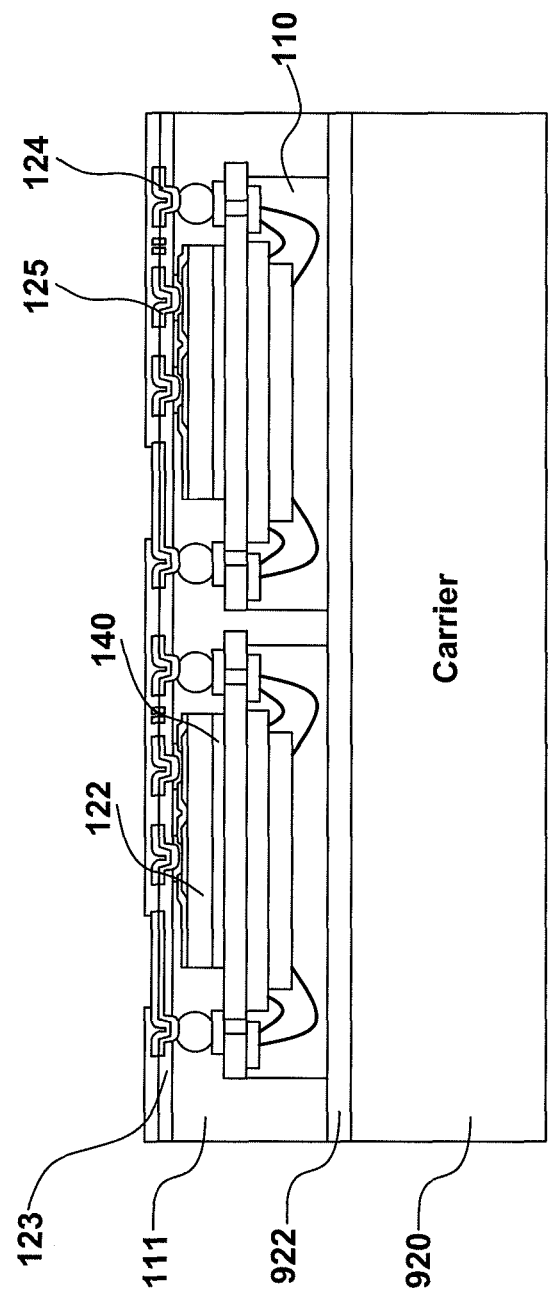
Figure 9H:
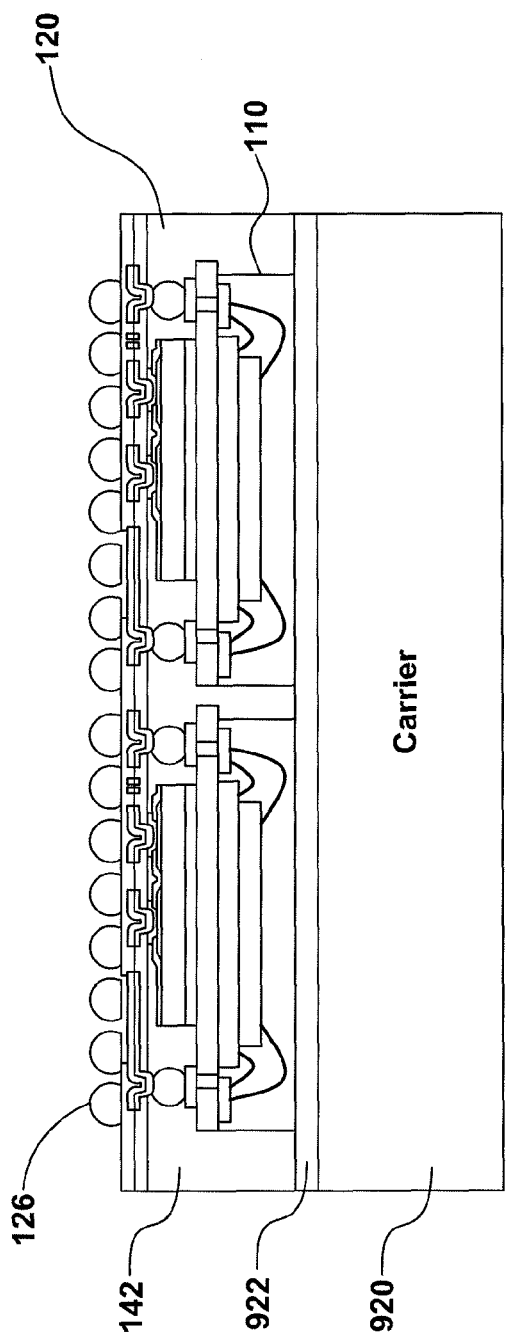

In FIG. 9G, a multi-layer redistribution layer 923 is formed including the conductive elements. The top package 110 is then electrically connected with the bottom package 120 by the conductive elements 117, 118 and 119. In FIG. 9H, additional conductive elements 126 are then formed by ball mounting according to one or more embodiments for electrical connection to other circuitry.

Figure 9I:
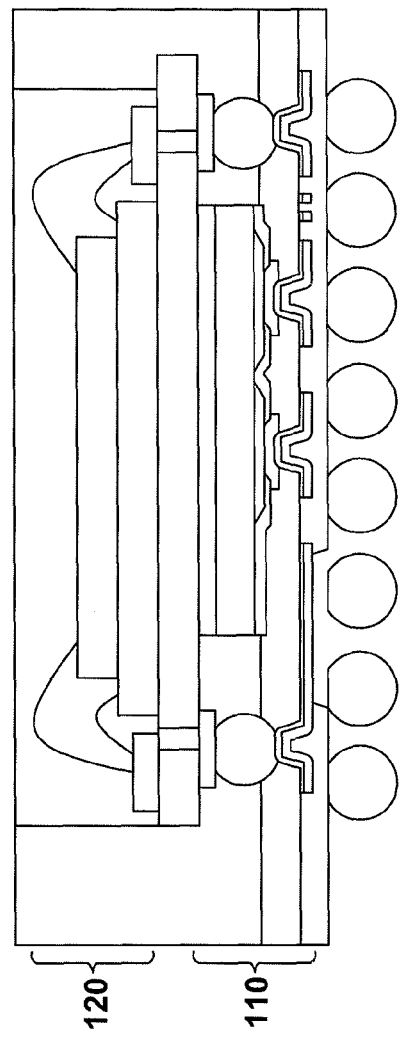

In FIG. 9I, the formation of the PoP semiconductor device is complete and the carrier 920 is removed by a de-bonding process.

FIGS. 10A through 10F are cross sectional views of a method for forming a bottom package in FIGS. 6 and 7 in accordance with one or more embodiments.

In FIG. 10A, a first die 621 and second die 622 are formed. The second die 622 is larger than the first die 621. A thermal contact pad 640, 740 is between the first die 621 and the second die 622. Further, conductive elements (e.g., metal pillars 627 and metal vias 628) are formed. In FIG. 10B, a molding compound 650 is then deposited and molded to surround the first die 621, a top surface of the second die 62 and the conductive elements 627 and 628.

In FIG. 10C, an etching or grinding operation is performed on a surface of the molding compound. The molding compound is etched to a top surface of the conductive elements 628. In FIG. 10D, a lower substrate (e.g., 625) is formed or provided on a surface the molding compound and conductive elements (e.g., metal contacts 626) and are formed in and at an opposite surface of the lower substrate 625 and then the first and second dies are electrically connected with the lower substrate 625 by the conductive elements 626, 627 and 628. In FIG. 10E, conductive elements (e.g. solder balls 655) are formed to connect the bottom package to other circuitry (e.g., a top package). Then, in FIG. 10F, a singulation process (see dashed lines) is then performed to separate the bottom packages.

FIGS. 11A through 11H are cross sectional views of a method for forming a bottom package such as the bottom package of FIG. 8 in accordance with one or more embodiments.

Figure 11A:
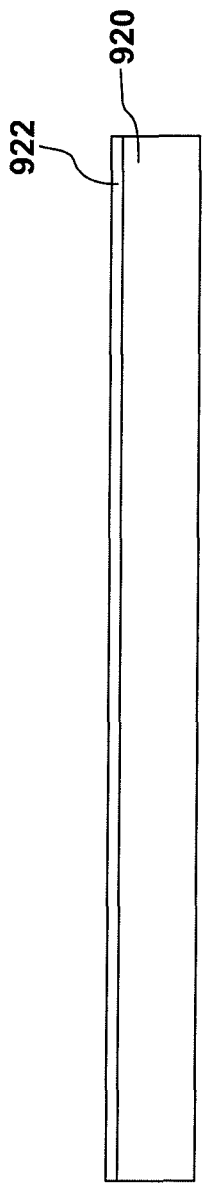
FIGS. 11A through 11H are cross sectional views of a method of forming bottom package in FIG. 8 in accordance with one or more embodiments.
Figure 11B:
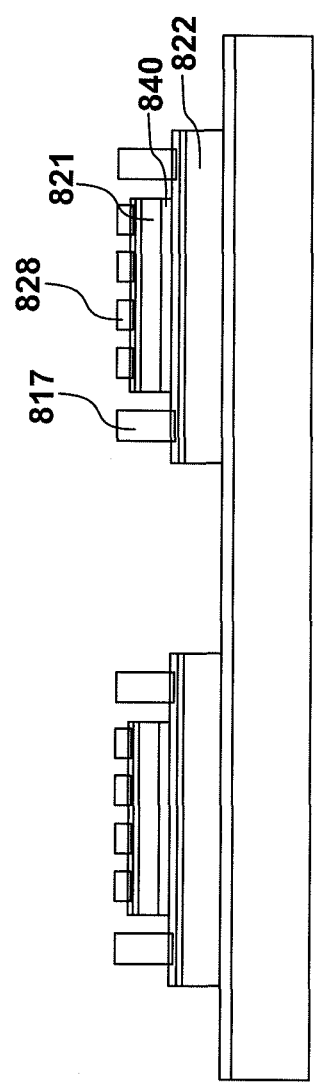

In FIG. 11A, a carrier (e.g., carrier 920 shown in FIG. 9A, for example) is prepared for processing. A thin adhesive layer 922 is deposited on the carrier 920 by a deposition process. Then, in FIG. 11B, a first die 821 and a second die 822 are deposited on the carrier 920. A thermal contact pad 840 is between the first die 821 and the second die 822. Further, conductive elements (e.g., metal pillars 817 and metal vias 828) are formed.

Figure 11C:
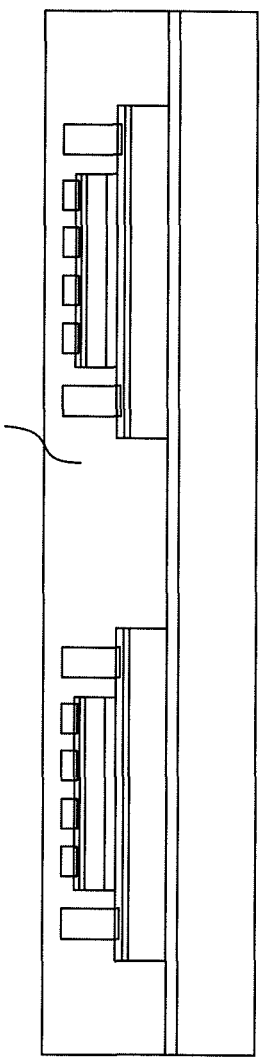
Figure 11D:
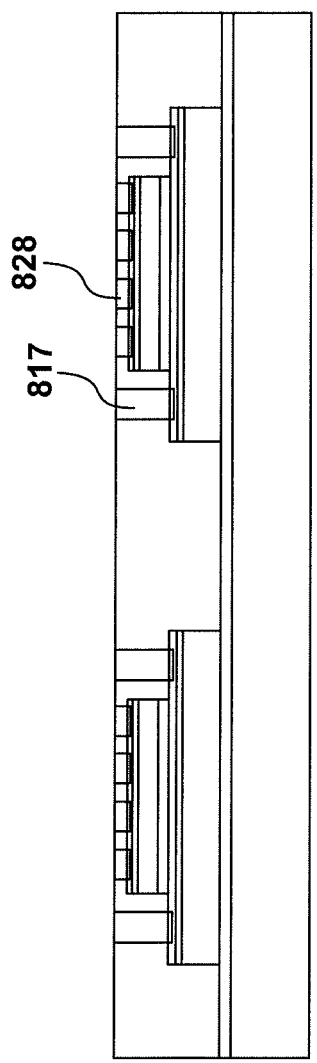

In FIG. 11C, a molding compound is molded via a molding operation, to surround the first die 821, the second die 822, and the conductive elements 817 and 828. In FIG. 11D, etching or grinding operation is performed where the molding compound is etched to a surface of the conductive elements 817 and 828.

Figure 11E:
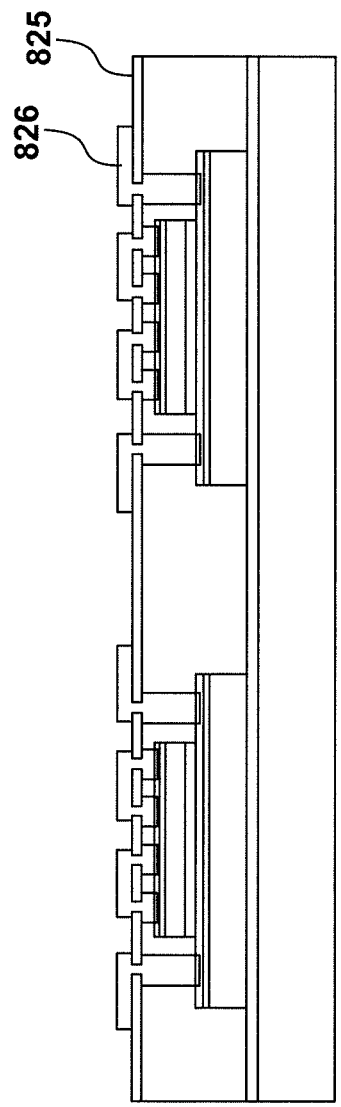
Figure 11F:
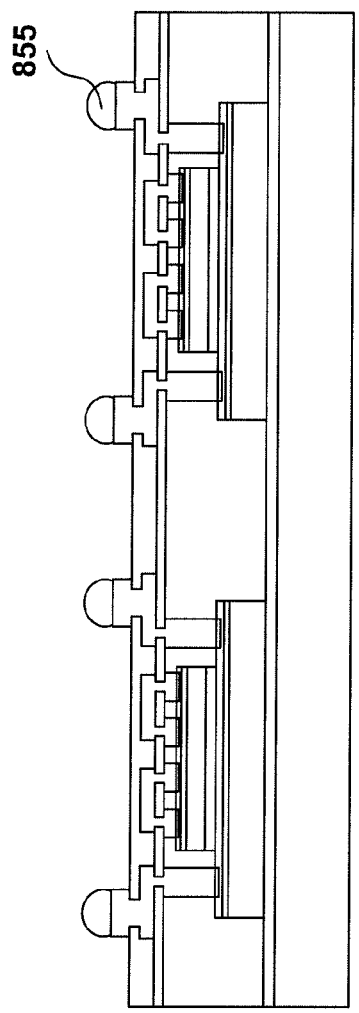

In FIG. 11E, a lower substrate 825 is formed on a surface the molding compound 850. Further, conductive elements (e.g., metal contacts 826) are formed at an opposite surface of the lower substrate 825 and the first and second dies 821 and 822 are connected with the PoP substrate 825 by the metal contacts 826. Conductive elements (e.g., solder balls 855) are then formed at a surface of the metal contacts 826.

Figure 11G:
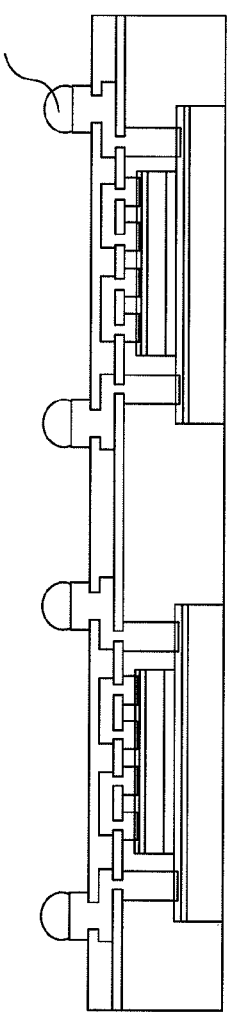
Figure 11H:
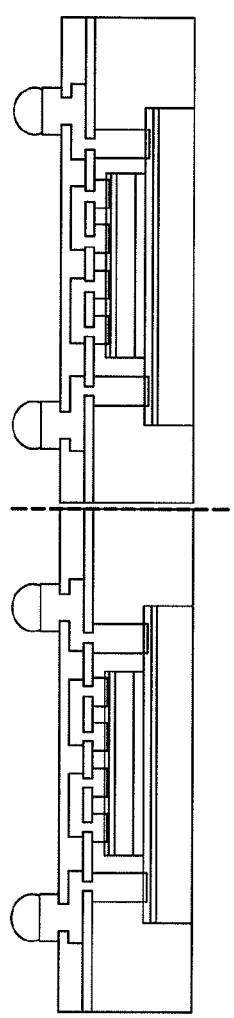

The carrier 920 is then removed in FIG. 11G, by a de-bonding process and a singulation process (see dashed line) is then performed in FIG. 11H.

One or more embodiments include a semiconductor device comprising a first package having at least one first die on a packaging substrate; a second package having at least one second die on a substrate; a first set of conductive elements electrically connecting the first package with the second package; a thermal contact pad between the first package and the second package, to thermally isolate the first package from the second package; and a molding compound surrounding the thermal contact pad and interposed between portions of the thermal contact pad.

One or more embodiments include a semiconductor device comprising a first package having at least one first die and one second die adjacent to each other on a first substrate; a second package having at least one third die on a second substrate; a first set of conductive elements electrically connecting the first package with the second package; and a thermal contact pad between the first package and the second package, to thermally isolate the first package from the second package.

One or more embodiments include a semiconductor device comprising a package having at least one first die and at least one second die; a set of conductive elements electrically connecting the at least one first and the at least one second die to a substrate; and a thermal contact pad between the at least one first die and the at least one second die, to thermally isolate the at least one first die from the at least one second die.

One or more embodiments include a method of forming a package-on-package semiconductor device, the method comprising forming an adhesive layer on a carrier; forming a first package on the carrier; forming a second package on the first package; forming a thermal contact pad between the first package and the second package to thermally isolate the first package from the second package; electrically connecting the first package to the second package by a first set of conductive elements; and removing the carrier to form the package-on-package semiconductor device.

One or more embodiments include a method of forming a semiconductor device, the method comprising forming at least one first die; forming at least one second die adjacent to the at least one first die; forming a thermal contact pad between the at least one first die and the at least one second die; forming a first set of conductive elements at a surface of the at least one first die and the at least one second die; molding a molding compound to surround the at least one first die, the at least one second die and the first set of conductive elements; grinding a surface of the molding compound; forming a substrate on a surface the molding compound; forming a second set of conductive elements at an opposite surface of the substrate then the at least one first die and the at least one second die to connect with the first set of conductive elements; forming conductive elements at a surface of the second set of conductive elements; and performing singulation.

One or more embodiments include a method of forming a semiconductor device, the method comprising forming an adhesive layer on a carrier; forming at least one first die and at least one second die on the carrier; forming a thermal contact pad between the at least one first die and the at least one second die; forming a first set of conductive elements at a surface of the at least one first die and the at least one second die; molding a molding compound to surround the at least one first die, the at least one second die and the first set of conductive elements; grinding a surface of the molding compound; forming a substrate on a surface the molding compound; forming a second set of conductive elements at an opposite surface of the substrate then the at least one first die and the at least one second die to connect with the first set of conductive elements; forming conductive elements at a surface of the second set of conductive elements; removing the carrier; and performing singulation.

Although the embodiments and their advantages have been described in detail, it should be understood that various changes, substitutions and alterations could be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A semiconductor device comprising:
   a package having at least one first die and at least one second die;
   a set of conductive elements electrically connecting the at least one first die and the at least one second die to a substrate;
   a thermal contact pad between the at least one first die and the at least one second die, for thermally isolating the at least one first die from the at least one second die; and
   a molding compound over the substrate, wherein the molding compound is between a portion of thermal contact pad and at least one conductive element of the set of conductive elements.

2. The semiconductor device of claim 1, wherein the set of conductive elements comprises conductive pads, conductive pillars and conductive vias, and the at least one second die is connected with the substrate via the conductive pads and the conductive pillars and the at least one first die is electrically connected with the substrate by the conductive vias.

3. The semiconductor device of claim 2, further comprising a molding compound between the substrate and the at least one second die, and between portions of the thermal contact pad and a seal ring, and the set of conductive elements.

4. The semiconductor device of claim 1, wherein the thermal contact pad is a non-continuous layer.

5. The semiconductor device of claim 1, wherein the thermal contact pad is a continuous layer sandwiched between the at least one first die and the at least one second die.

6. The semiconductor device of claim 1, wherein the molding compound surrounds the at least one first die and at least one second die.

7. A semiconductor device, comprising:
   a first package having at least one first die on a first substrate;
   a second package having at least one second die on a second substrate;
   a first set of conductive elements electrically connecting the first package with the second package;
   a thermal contact pad between the first package and the second package, for thermally isolating the first package from the second package, wherein the thermal contact pad has a thermal conductivity less than 0.5 Watts/Celsius; and
   a molding compound surrounding the thermal contact pad and interposed between portions of the thermal contact pad.

8. The semiconductor device of claim 7, further comprising a seal ring between the first package and the second package.

9. The semiconductor device of claim 7, wherein the thermal contact pad comprises at least one of an oxide material, a nitride material, a polymer material, or an adhesive material.

10. The semiconductor device of claim 7, wherein the thermal contact pad is a non-continuous layer.

11. The semiconductor device of claim 7, wherein the thermal contact pad is a continuous layer covering a total surface of the at least one second die, between the second die and the substrate.

12. The semiconductor device of claim 7, wherein the molding compound comprises a first molding compound on the first substrate and surrounding the first package including the first set of conductive elements and the at least one first die.

13. The semiconductor device of claim 12, wherein the molding compound further includes a second molding compound on the second substrate and surrounding the first molding compound, the second molding compound positioned between portions of the thermal contact pad and a seal ring between the first package and the second package.

14. The semiconductor device of claim 7, wherein the thermal contact pad has a thickness greater than approximately 10 microns.

15. The semiconductor device of claim 1, wherein the thermal contact pad has a thermal conductivity less than 0.5 Watts/Celsius.

16. The semiconductor device of claim 7, further comprising:
   a second set of conductive elements electrically connecting the at least one first die to the first substrate; and
   a third set of conductive elements electrically connecting the at least one second die to the second substrate.

17. A semiconductor device comprising:
   a first die;
   a second die bonded to the first die, wherein the first die is electrically connected to the second die;
   a thermal contact pad between the first die and the second die, wherein the thermal contact pad is configured to thermally isolate the first die from the second die; and
   a seal ring between the first die and the second die, wherein the seal ring is located around an outer perimeter of the thermal contact pad.

18. The semiconductor device of claim 17, wherein the thermal contact pad comprises plastic or silicone.

19. The semiconductor device of claim 17, wherein the thermal contact pad has a thermal conductivity less than or equal to about 0.5 Watts/Celsius (W/° C.).

20. The semiconductor device of claim 17, further comprising a molding compound surrounding the first die, wherein the molding compound is between the thermal contact pad and the seal ring.

* * * * *